US010684558B2

(12) United States Patent
Duijsens et al.

(10) Patent No.: US 10,684,558 B2
(45) Date of Patent: Jun. 16, 2020

(54) MOTOR ASSEMBLY, LITHOGRAPHIC APPARATUS AND DEVICE MANUFACTURING METHOD

(71) Applicant: ASML NETHERLANDS B.V., Veldhoven (NL)

(72) Inventors: Pim Jozef Hendrik Duijsens, Eindhoven (NL); Antonius Franciscus Johannes De Groot, Lierop (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/343,569

(22) PCT Filed: Sep. 27, 2017

(86) PCT No.: PCT/EP2017/074449
§ 371 (c)(1),
(2) Date: Apr. 19, 2019

(87) PCT Pub. No.: WO2018/072975
PCT Pub. Date: Apr. 26, 2018

(65) Prior Publication Data
US 2020/0050115 A1 Feb. 13, 2020

(30) Foreign Application Priority Data

Oct. 21, 2016 (EP) .................................... 16195045

(51) Int. Cl.
*G03F 7/20* (2006.01)
*H01L 21/68* (2006.01)
*H02K 41/03* (2006.01)

(52) U.S. Cl.
CPC ........ *G03F 7/70758* (2013.01); *G03F 7/2002* (2013.01); *G03F 7/70716* (2013.01);
(Continued)

(58) Field of Classification Search
CPC ............... G03F 7/2002; G03F 7/70716; G03F 7/70758; H01L 21/68; H02K 41/03; H02K 2201/18
(Continued)

(56) References Cited

U.S. PATENT DOCUMENTS

| 3,937,148 A * | 2/1976 | Simpson ............. F16C 32/0472 104/283 |
| 2001/0030522 A1 | 10/2001 | Lee |

(Continued)

OTHER PUBLICATIONS

International Search Report and Written Opinion issued in corresponding PCT Patent Application No. PCT/EP2017/074449, dated Feb. 2, 2018.

*Primary Examiner* — Colin W Kreutzer
(74) *Attorney, Agent, or Firm* — Pillsbury Winthrop Shaw Pittman LLP

(57) ABSTRACT

A motor assembly includes linear motors, each linear motor configured to generate a driving force in a driving direction and each having a first electromagnetic assembly and a second electromagnetic assembly, configured to co-operate with the first electromagnetic assembly, for generating the driving force, wherein the first electromagnetic assembly and the second electromagnetic assembly face each other and define a gap between each other in a direction perpendicular to the driving direction. A first interface connects the first electromagnetic assemblies to a common member. A second interface connects the second electromagnetic assemblies to the object to be driven. The first and second electromagnetic assemblies are stacked in the direction perpendicular to the driving direction, and the first and/or second interface is configured to enable a relative displacement between the respective first electromagnetic assemblies and the second electromagnetic assemblies in the direction perpendicular to the driving direction.

22 Claims, 10 Drawing Sheets

(52) U.S. Cl.
CPC .......... *H01L 21/68* (2013.01); *H02K 41/031* (2013.01); *H02K 2201/18* (2013.01)

(58) Field of Classification Search
USPC .......... 310/12.01, 12.05, 12.06; 355/72, 0.75
See application file for complete search history.

(56) References Cited

U.S. PATENT DOCUMENTS

| | | | |
|---|---|---|---|
| 2001/0055102 A1* | 12/2001 | Emoto | G03F 7/70525 |
| | | | 355/53 |
| 2005/0189901 A1 | 9/2005 | Tanaka | |
| 2009/0290137 A1* | 11/2009 | Vermeulen | G03F 7/707 |
| | | | 355/72 |
| 2015/0171722 A1* | 6/2015 | Hon | H02K 21/025 |
| | | | 310/12.24 |
| 2015/0212435 A1 | 7/2015 | Cox et al. | |

* cited by examiner

Prior art

MOTOR ASSEMBLY, LITHOGRAPHIC APPARATUS AND DEVICE MANUFACTURING METHOD

CROSS REFERENCE TO RELATED APPLICATIONS

This application is the U.S. national phase entry of PCT patent application no. PCT/EP2017/074449, which was filed on Sep. 27, 2017, which claims the benefit of priority of European patent application no. 16195045.6, which was filed on Oct. 21, 2016, and which applications are incorporated herein in its entirety by reference.

FIELD OF THE INVENTION

The present invention relates to a motor assembly, a lithographic apparatus and a method for manufacturing a device.

BACKGROUND ART

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate. In order to accurately position the patterning device relative to the substrate, the patterning device and substrate are mounted on object tables which are displaced by positioning devices, e.g. including planar or linear electromagnetic motors. In order to meet throughput expectations, a high force density of such motors is often expected. Electromagnetic motors as currently available may still have a force density which is below expectations.

SUMMARY OF THE INVENTION

It would be desirable to provide in a motor assembly having an improved force density compared to known electromagnetic motors.

According to an aspect of the invention, there is provided a motor assembly for driving an object in a driving direction, the motor assembly comprising:

a plurality of linear motors, each motor configured to generate a driving force in the driving direction, each of the linear motors comprising:

a first electromagnetic assembly and a second electromagnetic assembly, configured to co-operate with the first electromagnetic assembly, for generating the driving force;

wherein the first electromagnetic assembly and the second magnetic assembly face each other and define a gap between each other in a direction perpendicular to the driving direction;

a first interface for connecting the first electromagnetic assemblies to a common member;

a second interface for connecting the second electromagnetic assemblies to the object to be driven;

wherein the first electromagnetic assemblies and the second electromagnetic assemblies are stacked in the direction perpendicular to the driving direction, and wherein at least one of the first and second interfaces is configured to enable a relative displacement between the respective first electromagnetic assemblies and the second electromagnetic assemblies in the direction perpendicular to the driving direction.

According to a further an aspect of the invention, there is provided a motor assembly for driving an object in a driving direction, the motor assembly comprising:

a first electromagnetic assembly and a second electromagnetic assembly, wherein the second electromagnetic assembly comprises a first electromagnetic sub-assembly configured to co-operate with the first electromagnetic assembly for generating a first driving force in the driving direction and a second electromagnetic sub-assembly configured to co-operate with the first electromagnetic assembly for generating a second driving force in the driving direction; wherein the first electromagnetic sub-assembly faces a first surface of the first electromagnetic assembly, thereby defining a first gap between the first electromagnetic assembly and the second electromagnetic assembly in a direction perpendicular to the driving direction; wherein the second electromagnetic sub-assembly faces a second surface of the first electromagnetic assembly, thereby defining a second gap between the first electromagnetic assembly and the second electromagnetic assembly in the direction perpendicular to the driving direction;

a first interface for connecting the first electromagnetic assembly to one of a common member or the object to be driven;

a second interface for connecting the second electromagnetic assembly to the other one of the common member or the object to be driven;

wherein the first electromagnetic assembly, the first electromagnetic sub-assembly and the second electromagnetic sub-assembly are stacked in the direction perpendicular to the driving direction, and wherein the second interface is configured to enable a relative displacement between the first and the second electromagnetic sub-assembly in the direction perpendicular to the driving direction.

According to yet a further aspect of the invention, there is provided a lithographic apparatus comprising:

an illumination system configured to condition a radiation beam;

a support constructed to support a patterning device, the patterning device being capable of imparting the radiation beam with a pattern in its cross-section to form a patterned radiation beam;

a substrate table constructed to hold a substrate; and a projection system configured to project the patterned radiation beam onto a target portion of the substrate;

wherein the lithographic apparatus further comprises a motor assembly according to any of the preceding claims for positioning the support or the substrate table.

According to yet a further aspect of the invention, there is provided a device manufacturing method, the method comprising projecting a patterned beam of radiation onto a substrate using a lithographic apparatus according to the invention.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
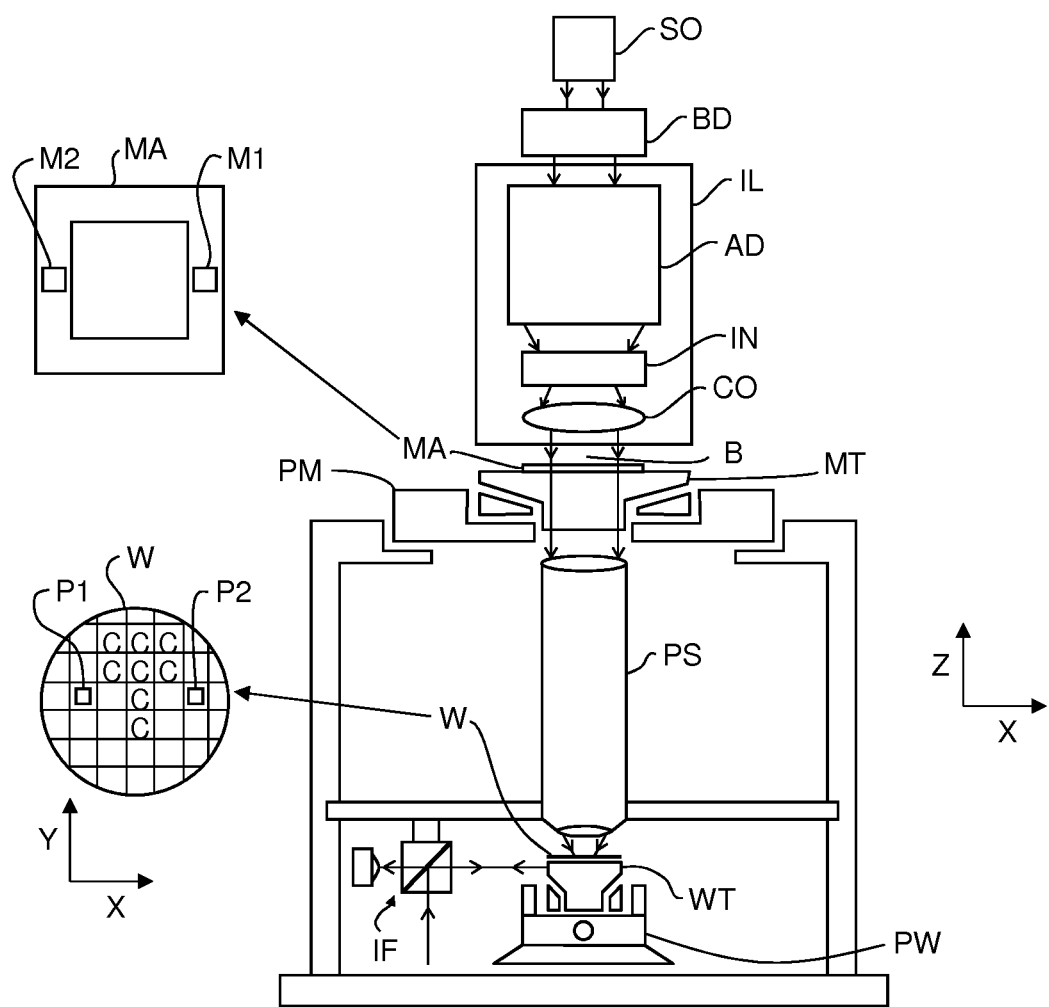
FIG. 1 depicts a lithographic apparatus according to an embodiment of the invention.

FIG. 1 schematically depicts a lithographic apparatus according to one embodiment of the invention. The lithographic apparatus comprises an illumination system IL, a support structure MT, a substrate table WT and a projection system PS. The illumination system IL is configured to condition a radiation beam B. The support structure MT is constructed to support a patterning device MA and is connected to a first positioning device PM configured to accurately position the patterning device MA in accordance with certain parameters. The substrate table WT is constructed to hold a substrate W, e.g., a resist-coated wafer, and is connected to a second positioner PW configured to accurately position the substrate W in accordance with certain parameters. The projection system PS is configured to project a pattern imparted to the radiation beam B by patterning device MA onto a target portion C (e.g. comprising one or more dies) of the substrate W.

The illumination system IL may include various types of optical components, such as refractive, reflective, magnetic, electromagnetic, electrostatic or other types of optical components, or any combination thereof, for directing, shaping, or controlling radiation.

The illumination system IL receives the radiation beam B from a radiation source SO. The radiation source SO and the lithographic apparatus may be separate entities, for example when the radiation source SO is an excimer laser. In such cases, the radiation source SO is not considered to form part of the lithographic apparatus and the radiation beam B is passed from the radiation source SO to the illumination system IL with the aid of a beam delivery system BD comprising, for example, suitable directing mirrors and/or a beam expander. In other cases the radiation source SO may be an integral part of the lithographic apparatus, for example when the radiation source SO is a mercury lamp. The radiation source SO and the illumination system IL, together with the beam delivery system BD if required, may be referred to as a radiation system.

The illumination system IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illumination system IL can be adjusted. In addition, the illumination system IL may comprise various other components, such as an integrator IN and a condenser CO. The illumination system IL may be used to condition the radiation beam B, to have a desired uniformity and intensity distribution in its cross-section.

The term "radiation beam" used herein encompasses all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The support structure MT supports, i.e. bears the weight of, the patterning device MA. The support structure MT holds the patterning device MA in a manner that depends on the orientation of the patterning device MA, the design of the lithographic apparatus, and other conditions, such as for example whether or not the patterning device MA is held in a vacuum environment. The support structure MT can use mechanical, vacuum, electrostatic or other clamping techniques to hold the patterning device MA. The support structure MT may be a frame or a table, for example, which may be fixed or movable as required. The support structure MT may ensure that the patterning device MA is at a desired position, for example with respect to the projection system PS.

The term "patterning device" used herein should be broadly interpreted as referring to any device that can be used to impart a radiation beam with a pattern in its cross-section such as to create a pattern in a target portion C of the substrate W. It should be noted that the pattern imparted to the radiation beam B may not exactly correspond to the desired pattern in the target portion C of the substrate W, for example if the pattern includes phase-shifting features or so called assist features. Generally, the pattern imparted to the radiation beam B will correspond to a particular functional layer in a device being created in the target portion C, such as an integrated circuit.

The patterning device MA may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in the radiation beam B which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum.

As here depicted, the lithographic apparatus is of a transmissive type (e.g. employing a transmissive mask). Alternatively, the lithographic apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure. An additional table may be arranged to hold at least one sensor, instead of holding a substrate W. The at least one sensor may be a sensor to measure a property of the projection system PS, a sensor to detect a position of a marker on the patterning device MA relative to the sensor or may be any other type of sensor. The additional table may comprise a cleaning device, for example for cleaning part of the projection system PS or any other part of the lithographic apparatus.

The lithographic apparatus may also be of a type wherein at least a portion of the substrate W may be covered by a liquid having a relatively high refractive index, e.g. water, so as to fill a space between the projection system PS and the substrate W. An immersion liquid may also be applied to other spaces in the lithographic apparatus, for example, between the patterning device MA and the projection system PS. Immersion techniques are well known in the art for increasing the numerical aperture of projection systems. The term "immersion" as used herein does not mean that a structure, such as a substrate W, must be submerged in liquid, but rather only means that liquid is located between the projection system PS and the substrate W during exposure.

The radiation beam B is incident on the patterning device MA, which is held on the support structure MT, and is patterned by the patterning device MA. Having traversed the support structure MT, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module and a short-stroke module, which form part of the first positioner PM. The long-stroke module provides movement of the support structure MT over a large range with limited accuracy (coarse positioning), whereas the short-stroke module provides movement of the support structure MT relative to the long-stroke module over a small range with high accuracy (fine positioning). Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. In an embodiment, the lithographic apparatus according to the present invention, may comprise a motor assembly according to the present invention as part of either the first positioner PM or the second positioner PM. In particular, the motor assembly according to the present invention may advantageously be applied as a long stroke mover for movement of the support structure MT over a comparatively large range.

Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions C. Substrate alignment marks P1, P2 are known as scribe-lane alignment marks, when they are located in spaces between the target portions C. Similarly, in situations in which more than one die is provided on the patterning device MA, the mask alignment marks M1, M2 may be located between the dies.

The depicted apparatus could be used in at least one of the following modes:

In a first mode, the step mode, the support structure MT and the substrate table WT are kept essentially stationary, while an entire pattern imparted to the radiation beam B is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

In a second mode, the scan mode, the support structure MT and the substrate table WT are scanned synchronously while a pattern imparted to the radiation beam B is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion C in a single dynamic exposure, whereas the length of the scanning motion determines the height (in the scanning direction) of the target portion C.

In a third mode, the support structure MT is kept essentially stationary holding a programmable patterning device MA, and the substrate table WT is moved or scanned while a pattern imparted to the radiation beam B is projected onto a target portion C. In this mode, generally a pulsed radiation source is employed and the programmable patterning device MA is updated as required after each movement of the substrate table WT or in between successive radiation pulses during a scan. This mode of operation can be readily applied to maskless lithography that utilizes programmable patterning device, such as a programmable mirror array of a type as referred to above.

The lithographic apparatus further includes a control unit which controls the actuators and sensors described. The control unit also includes signal processing and data processing capacity to implement desired calculations relevant to the operation of the lithographic apparatus. In practice, the control unit will be realized as a system of many sub-units. Each sub-unit may handle the real-time data acquisition, processing and/or control of component within the lithographic apparatus. For example, one sub-unit may be dedicated to servo control of the second positioner PW. Separate sub-units may handle the short-stroke module and the long-stroke module, or different axes. Another sub-unit may be dedicated to the readout of the position sensor IF. Overall control of the lithographic apparatus may be controlled by a central processing unit, communicating with the sub-units, with operators and with other apparatuses involved in the lithographic manufacturing process.

Combinations and/or variations on the above described modes of use or entirely different modes of use may also be employed.

The present invention relates to a motor assembly which may e.g. be applied in a lithographic apparatus for displacing or positioning object tables, e.g. object tables for holding a patterning device or substrate.

Various types of linear motors have been applied for driving such object tables. Known electromagnetic motors typically include a first electromagnetic assembly that is configured to co-operate with a second electromagnetic assembly for generating a driving force in a driving direction. As an example, the first electromagnetic assembly may e.g. be a magnet assembly comprising an array of permanent magnets, the array extending in the driving direction, whereas the second electromagnetic assembly may e.g. be a coil assembly, comprising an array of coils, e.g. mounted to a magnetic member such as a ferromagnetic member. In such arrangement, the coils of the coil assembly are typically constructed and arranged to face the permanent magnets of the magnet assembly, whereby a gap (in a direction perpendicular to a plane that is parallel to an outer surface of the coil assembly or magnet assembly) is maintained between the coil assembly and the magnet assembly, e.g. by means of a preloaded air bearing or the like.

Figure 2A:
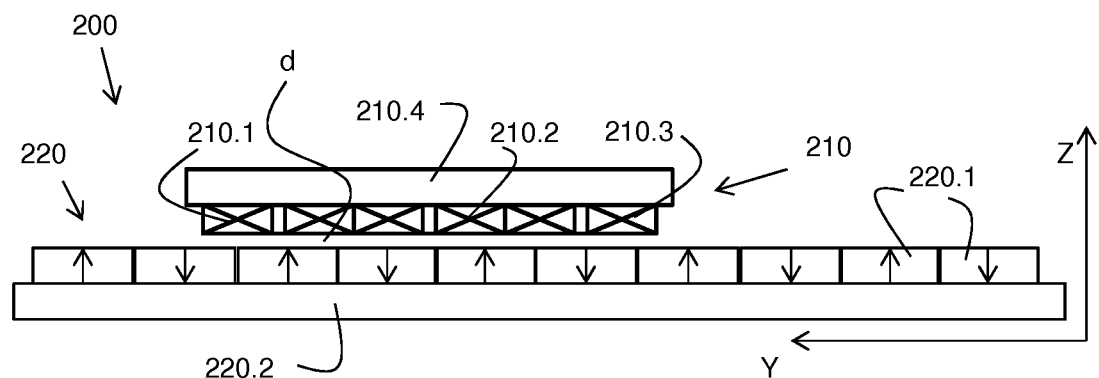
FIGS. 2a and 2b depicts cross-sectional views of linear motors as know in the art.
Figure 2B:
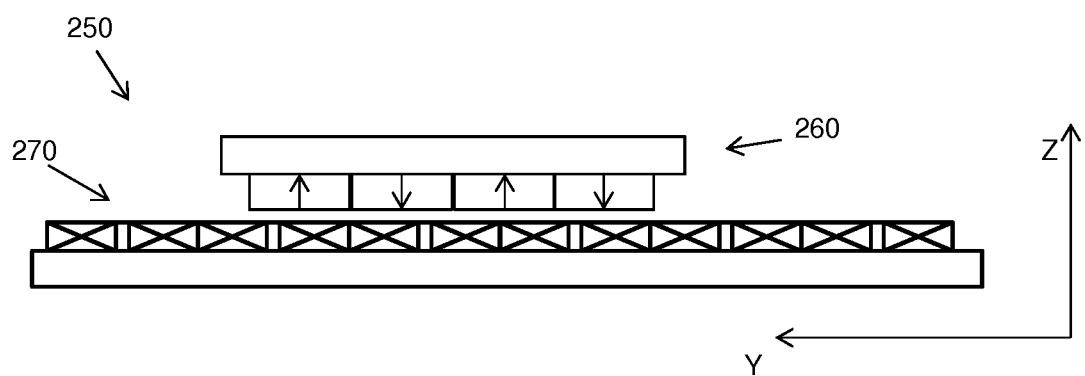

Such linear motors are schematically shown in FIGS. 2*a* and 2*b*. FIG. 2*a* schematically shows a cross-section view of a linear motor 200 comprising a coil assembly 210 and a magnet assembly 220. The coil assembly 210 comprises an array of three coils 210.1, 210.2 and 210.3 that are mounted on a member 210.4, e.g. a ferromagnetic member. The magnet assembly 220 comprises an array of alternatingly magnetized permanent magnets 220.1 that are mounted on a member 220.2, e.g. a ferromagnetic member. As shown, the coils 210.1, 210.2 and 210.3 of the coil assembly face the magnets of the magnet assembly and are separated by a distance d, referred to as the airgap, motor gap or gap. Distance d is further referred to as gap d. During operation, the coils of the coil assembly 210 are provided with a current that interacts with the magnetic field generated by the permanent magnets 220.1, in order to generate a force, e.g. a force in a driving direction, e.g. the Y-direction. In the embodiment as shown, the coil assembly 210 may e.g. be connected to an object (not shown) that is to be displace in the driving direction, i.e. the Y-direction. In order to maintain the gap d between the magnet assembly 220 and the coil assembly 210, a bearing, such as a preloaded gas bearing (not shown) may be provided.

In an alternative arrangement, as shown in FIG. 2*b*, a linear motor 250 may have a magnet assembly 260 that may be connected to the object to be moved, e.g. in the Y-direction, while the coil assembly 270 of the motor 250 is kept stationary, e.g. mounted to a frame, or is configured to displace in opposite direction, due to the reaction forces exerted on it, such an arrangement being known as a balance mass arrangement.

Such motors as shown in FIGS. 2*a* and 2*b*, i.e. motors having a single magnet assembly facing a single coil assembly, are typically referred to as single-sided linear motors.

Different improvements to such motors have been proposed in order to increase the force density the motor. Within the meaning of the present invention, force density of a linear motor refers to the available power per kilogram of moving motor mass, the moving motor mass referring to the mass of the motor part (either the coil assembly or the magnet assembly) that is connected to the object that is to be displaced.

Figure 3:
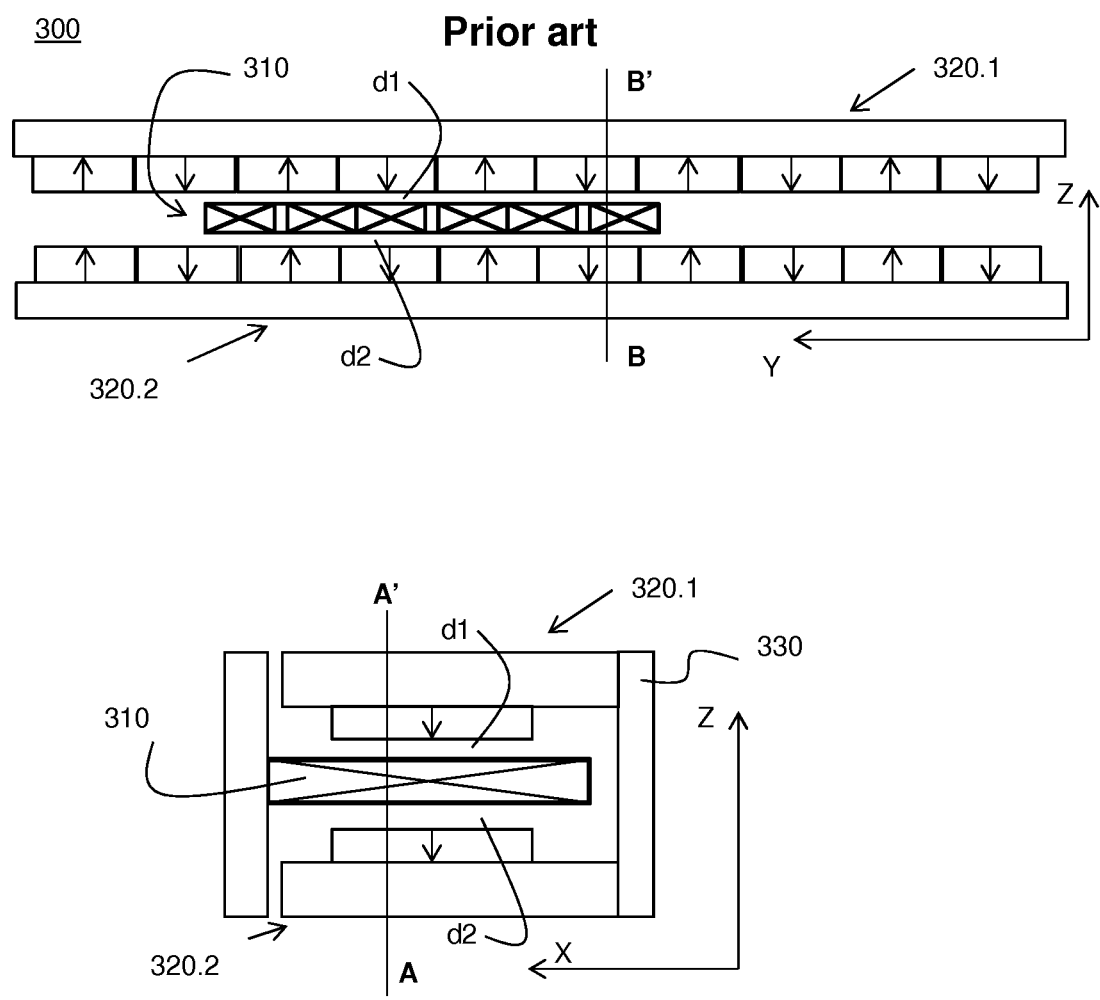
FIG. 3 depicts cross-sectional views of a double-sided linear motor as know in the art.

In order to increase the performance of the linear motors as shown in FIGS. 2*a* and 2*b*, it is e.g. proposed to increase the magnetic field as perceived by the coil assembly. This can e.g. be done by enclosing a coil assembly by two magnet assemblies, as e.g. shown in FIG. 3. FIG. 3 schematically shows an YZ cross-sectional view, taken along line A-A' and an XZ cross-sectional view, taken along the line B-B' of a linear motor as known in the field. The motor 300 comprises a coil assembly 310 (comprising three coils arranged adjacent each other in the driving direction, i.e. the Y-direction) and a pair of magnet assemblies 320.1 and 320.2, e.g. similar to the magnet assembly 210 of FIG. 2*a*, provided on opposite sides of the coil assembly 310. By doing so the magnetic field as perceived by the coil assembly 310 can be increased. Alternatively, a magnet assembly could be provided that is enclosed by two coil assemblies. In such a motor, one can identify two gaps in a direction (the Z-direction in the figure) perpendicular to the driving direction, i.e. a gap d1 between the coil assembly 310 and the magnet assembly 320.1 and a gap d2 between the coil assembly 310 and the magnet assembly 320.2. In the embodiment as shown, the magnet assemblies 320.1, 320.2 are mounted on a member 330 configured to keep the magnet assemblies 320.1, 320.2 spaced apart, such that gaps d1 and d2 are realized between the coil assembly 310 and the magnet assemblies 320.1, 320.2. Member 330 may further serve to synchronize the positions of the magnets in the Y-direction and keep the positions substantially constant. Such motors may also be referred to as double-sided linear motors or U-channel motors.

The force density of such a motor is improved compared to design as shown in FIGS. 2*a* and 2*b*, but the improvement that can be obtained is still rather limited.

One of the reasons why the obtainable improvement is rather limited is that, compared to the single sided linear motors, it may be difficult, if not impossible, to maintain both gaps of such a double-sided linear motor, e.g. gaps d1, d2 as shown in FIG. 3, within desired limits. In this respect, it can be pointed out that the force density of a linear motor is strongly affected by the gap d between the magnet assembly and the coil assembly. In particular, it is advantageous, with respect to the force density of the motor, to maintain the gap d between the coil assembly and the magnet assembly as small as possible.

Figure 4:
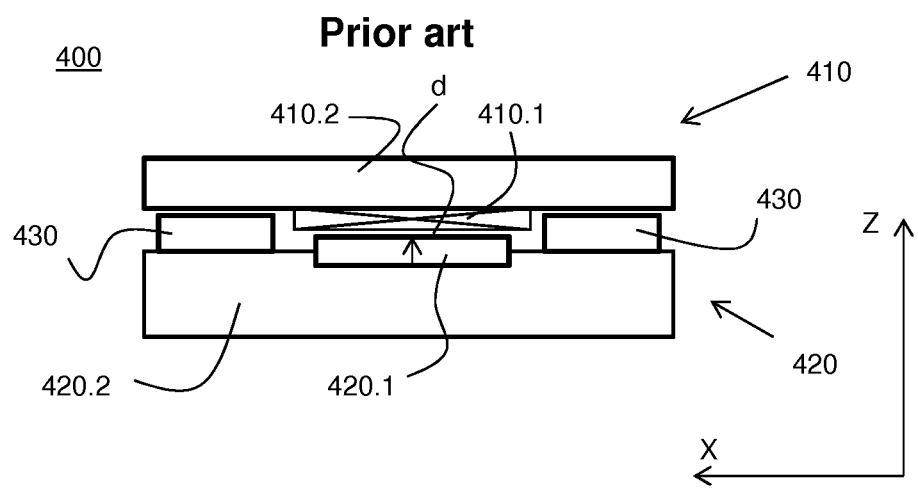
FIG. 4 depicts a cross-sectional view of a linear motors as know in the art, including a bearing.

It will be appreciated by the skilled person that the gap d between the magnet assembly and the coil assembly in a single sided linear motor may be accurately controlled, and kept to a comparatively small value, by means of a preloaded bearing. FIG. 4 schematically shows a cross-sectional view, in a plane perpendicular to the driving direction, of a single-sided linear motor 400 including such a bearing. FIG. 4 schematically shows a coil assembly 410 and a magnet assembly 420. The coil assembly 410 comprises a coil 410.1 mounted to a ferromagnetic member 410.2, whereas the magnet assembly 420 comprises a permanent magnet 420.1 mounted to a member 420.2, e.g. a ferromagnetic member. FIG. 4 further schematically shows a bearing 430 configured to maintain the coil assembly and the magnet assembly spaced apart in the Z-direction, i.e. perpendicular to the driving direction, thereby creating a gap d between the coil 410.1 of the coil assembly 410 and the magnet 420.1 of the magnet assembly 420. Such a bearing 430 may e.g. a pre-loaded air bearing, e.g. pre-loaded by the attractive force between the permanent magnet 420.1 and the ferromagnetic member 410.2. by doing so, a bearing can be generated having a comparatively high stiffness in the Z-direction, e.g. 1e8-1e9 N/m and enabling the application of a comparatively small airgap or gap d. In particular, using such pre-loaded bearings, a gap d of e.g. 0.5 mm or less may be realized.

In case of a double-sided linear motor, as e.g. shown in FIG. 3, the size of the gaps d1, d2 between the coil assembly and the magnet assemblies on both sides of the coil assembly depends on the distance at which the magnet assemblies are separated from each other and thus on the manner in which the magnet assemblies are mounted relative to each other. In this respect it is submitted that, due to mechanical tolerances and available accuracies in mounting the magnet assemblies, the gaps d1 and d2 will typically be larger than the gap d which can be applied in a single sided linear motor. Typical values for d1 and d2 may e.g. be in the range of 1-1.5 mm.

In order to further improve the force density in linear motors, the present invention provides in a motor assembly comprising a plurality of magnet assemblies that is configured to co-operate with a respective plurality of coil assemblies to generate driving forces for driving an object such as an object table, whereby gaps between the co-operating magnet assemblies and coil assemblies can be more accurately controlled. In particular, the motor assembly according to the present invention can be considered a stacked arrangement of a plurality of first and second electromagnetic assemblies which co-operate to generate forces in a driving direction. In such arrangement, each pair of a first electromagnetic assembly and a co-operating second electromagnetic assembly may be considered a linear motor of the motor assembly, having a gap between the assemblies in a direction perpendicular to the driving direction. In accordance with the present invention, a bearing is provided for maintaining the gap between each pair of a first electromagnetic assembly and a co-operating second electromagnetic assembly. Note that, within the meaning of the present invention, reference to an electromagnetic assembly may either refer to a magnet assembly, e.g. comprising an array of permanent magnets, or to a coil assembly, e.g. comprising an array of coils. In accordance with the present invention, the first electromagnetic assemblies are connected to a first interface that is configured to connect the first electromagnetic assemblies to the object that is to be driven, while the second electromagnetic assemblies are connected to a second interface that is configured to connect the second assemblies to a common member, e.g. a frame or a base or a balance mass arrangement.

In accordance with the present invention, at least one of the first and second interfaces is configured to enable a relative displacement between the respective first electromagnetic assemblies and the second electromagnetic assemblies in the direction perpendicular to the driving direction. The first interface 530 may be configured to enable a relative displacement between the first electromagnetic assemblies. The second interface 540 may be configured to enable a relative displacement between the second electromagnetic assemblies. As a result, the gaps that are arranged between each pair of co-operating electromagnetic assemblies can be more easily maintained and may be controlled independently.

Figure 5:
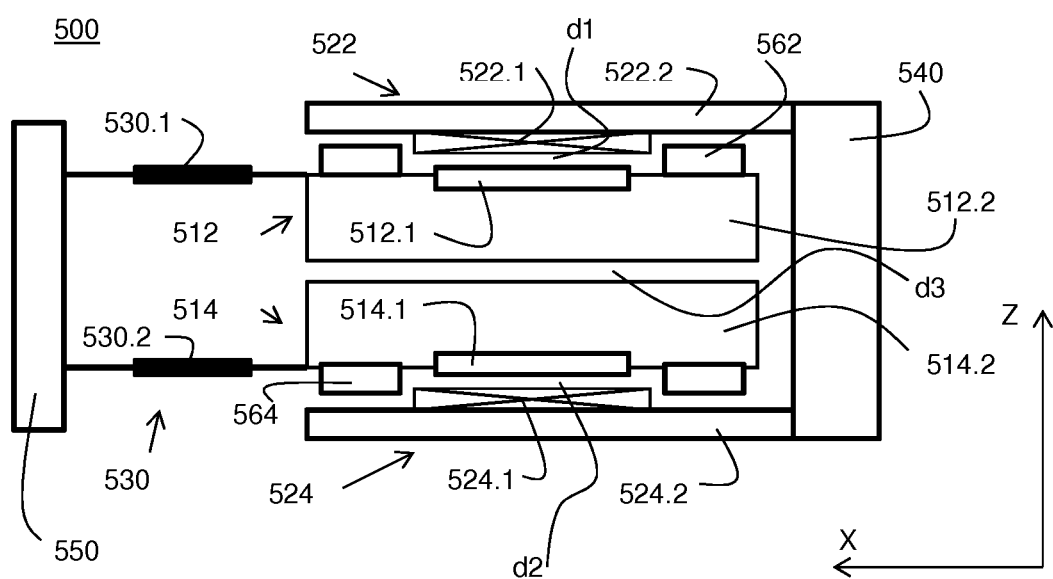
FIG. 5 depicts a cross-sectional view of a first embodiment of a motor assembly according to the present invention.

FIG. 5 schematically shows a cross-sectional view of a motor assembly according to an embodiment of the present invention. The motor assembly 500 comprises a first linear motor comprising a first magnet assembly 512 that is constructed and arranged to co-operate with a first coil assembly 522. The assembly 500 further comprises a second linear motor comprising a second magnet assembly 514 constructed and arranged to co-operate with a second coil assembly 524. In the embodiment as shown, the magnet assemblies 512, 514 each comprise an array of permanent magnets 512.1, 514.1, arranged adjacent each other in a direction perpendicular to the plane of the drawing, and mounted to respective members 512.2 and 514.2 in the embodiment as shown, the coil assemblies 522, 524 each comprise an array of coils 522.1, 524.1, arranged adjacent each other in a direction perpendicular to the plane of the drawing, and mounted to respective members 522.2, 524.2, e.g. ferromagnetic members. The motor assembly 500 further comprises a first interface 530 that is constructed to connect the magnet assemblies 512, 514 to an object 550, e.g. an object table that is to be driven in a driving direction, e.g. perpendicular to the plane of the drawing. The motor assembly 500 further comprises a second interface 540 that is constructed, in the embodiment as shown, to rigidly couple the coil assemblies 522, 524, such an interface 540 may further be coupled to a frame or other stationary structure or may be coupled to a balance mass.

In the embodiment as shown, the interface 530 is configured to enable a displacement of the coil assemblies 522, 524 relative to each other in a direction perpendicular to the driving direction, in particular in the Z-direction. More specifically, in the embodiment as shown, the interface 530 comprises leaf springs 530.1 and 530.2 for connecting the magnet assemblies to the object 550. The embodiment of the motor assembly as schematically shown in FIG. 5 further comprises a first bearing 562 constructed and arranged to maintain the first magnet assembly 512 and the first coil assembly 522 spaced apart and a second bearing 564 constructed and arranged to maintain the second magnet assembly 514 and the second coil assembly 524 spaced apart. Such bearings may e.g. be preloaded air bearings or the like by means of these bearings, gaps d1 and d2 between the magnet assemblies 512, 514 and the co-operating coil assemblies 522, 524 can be maintained during operation.

Compared to the double-sided linear motor as schematically shown in FIG. 3, the motor assembly 500 as schematically shown in FIG. 5 enables the gaps d1, d2, between the magnet assemblies and co-operating coils assemblies to be controlled and kept comparatively small, irrespective of the distance at which the coil assemblies 522, 524 are mounted apart from each other. Due the flexibility of the interface 530, the interface enabling a displacement of the magnet assemblies 512 and 514 relative to each other in the Z-direction, the magnet assemblies 512, 514 are enabled to independently 'follow' the Z-position of the respective coil assemblies 522, 524, thus enabling maintaining an accurate and small gap d1, d2 between the magnet assemblies 512, 514 and co-operating coil assemblies 522, 524. Phrased differently, in case the distance between the coil assemblies 522, 524 in the Z-direction would vary along the Y-direction (the Y-direction being perpendicular to the XZ-plane), the gaps could d1 and d2 could still be maintained due to the displacement or displaceability of the magnet assemblies 512, 514 in the Z-direction. A variation along the Y-direction of the distance between the coil assemblies in the Z-direction would thus only result in a variation of the gap d3 between the magnet assemblies 512, 514.

Figure 6:
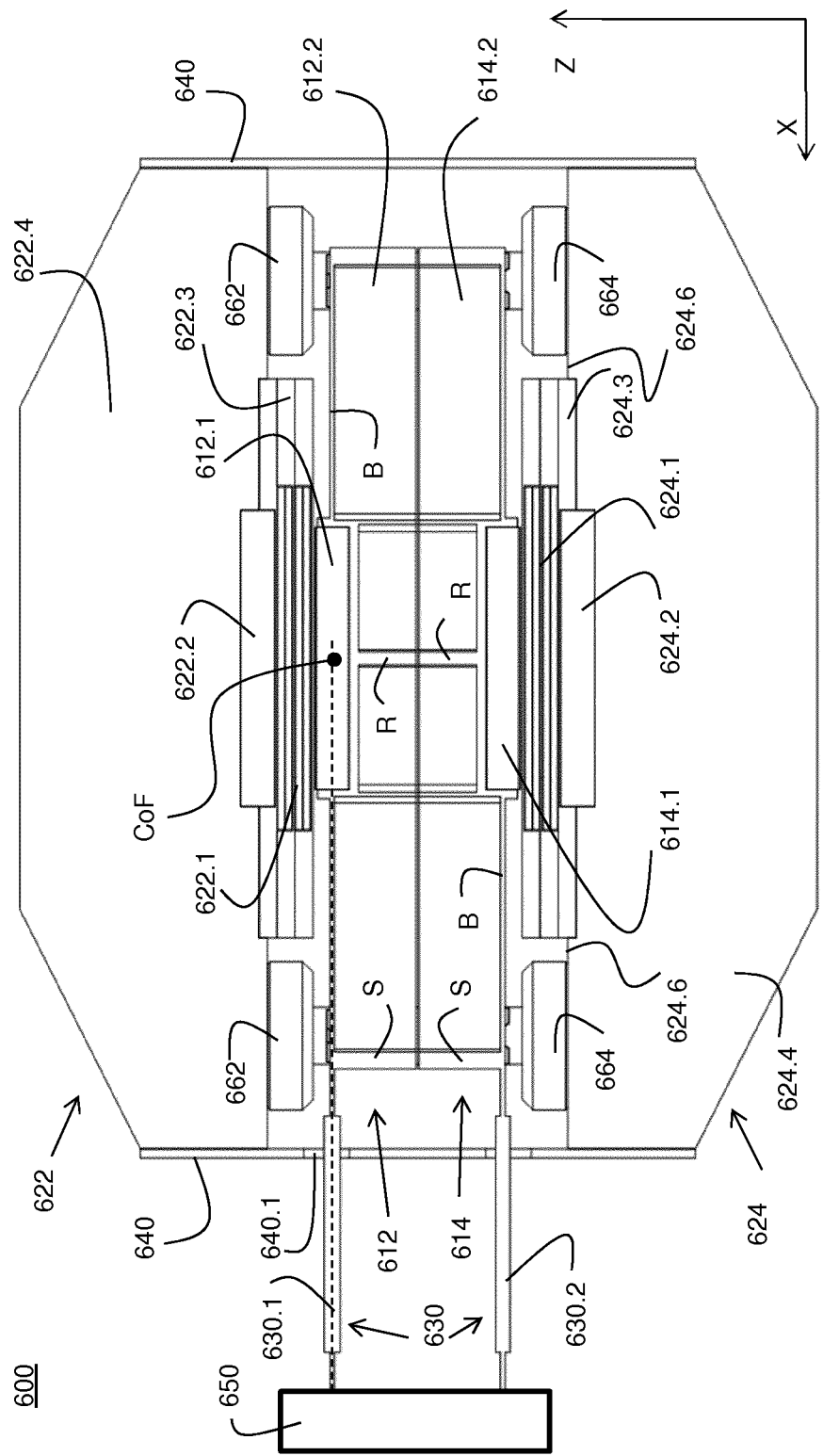
FIG. 6 depicts a cross-sectional view of a second embodiment of a motor assembly according to the present invention.

FIG. 6 schematically shows a more detailed cross-sectional view of a motor assembly 600 according to the present invention. FIG. 6 schematically depicts a motor assembly 600 having a first linear motor comprising a first magnet assembly 612 that is constructed and arranged to co-operate with a first coil assembly 622. The assembly 600 further comprises a second linear motor comprising a second magnet assembly 614 constructed and arranged to co-operate with a second coil assembly 624. In the embodiment as shown, the magnet assemblies 612, 614 each comprise an array of permanent magnets 612.1, 614.1, arranged adjacent each other in a direction perpendicular to the plane of the drawing, and mounted to respective members 612.2 and 614.2. In the embodiment as shown, the members 612.2 and 614.2 are lightweight structures having an open box structure having reinforcement ribs inside (see e.g. further on). The cross-sectional view of FIG. 6 e.g. shows the bottoms B of the open box structured members 612.2 and 614.2, the sidewalls S of the structures and some of the reinforcement ribs R. Such an open box structure 612.2, 614.2 may e.g. be machined by means of milling out of an aluminum part, e.g. aluminum 5083. This material has a comparatively low density, has a relatively high fatigue strength and good machining properties. In the embodiment as shown, the magnet arrays 612.1, 614.1 are partly embedded in the bottoms B of the structures 612.2, 614.2. In the embodiment as shown, the coil assemblies 622, 624 each comprise an array of coils 622.1, 624.1, arranged adjacent each other in a direction perpendicular to the plane of the drawing. In the embodiment as shown, the coil arrays 622.1, 624.1 are mounted in coil units 622.3, 624.3 respectively which are mounted to members 622.4 and 624.4 of the coil assemblies 622, 624, whereby said members 622.4 and 624.4 may serve as a balance mass. In the embodiment as shown, the coil assemblies 622 and 624 are further provided with ferromagnetic members (also referred to as back-irons) 622.2, 624.2 for guiding the magnetic field generated by the magnets of the magnet arrays and of the coils of the coil arrays during operating. The motor assembly 600 further comprises a first interface 630 that is constructed to connect the magnet assemblies 612, 614 to an object 650, e.g. an object table that is to be driven in a driving direction, e.g. perpendicular to the plane of the drawing. The motor assembly 600 further comprises a second interface 640 that is constructed, in the embodiment as shown, to rigidly couple the coil assemblies 622, 624, such an interface 640 may further be coupled to a frame or other stationary structure, it may be coupled to a balance mass or it may constitute a balance mass or be a part thereof. In order to enable a displacement of the magnet assemblies and the interface 630 relative to the coil assemblies in the Y-direction, i.e. perpendicular to the plane of the drawing, an aperture 640.1 is provided in the interface, the aperture extending in the Y-direction.

In the embodiment as shown, the interface 630 is configured to enable a displacement of the coil assemblies 622, 624 relative to each other in a direction perpendicular to the driving direction, in particular in the Z-direction. More specifically, in the embodiment as shown, the interface 630 comprises leaf springs 630.1 and 630.2 for connecting the magnet assemblies to the object 650. In the arrangement as shown, the leaf springs 630.1 and 630.2 provide in a flexible connection between the magnet assemblies 612, 614 and the object 650 in the Z-direction, while providing a substantially rigid connection in the X-direction and in the driving direction, i.e. the Y-direction, perpendicular to the XZ-plane of the drawing. In a preferred embodiment, the leaf springs 630.1, 630.2 are provided in a plane through the center of force CoF of the magnet arrays 612.1, 614.1, as indicated by the dotted line. In the embodiment as shown, the bottom B of the open box structured member 612.2 is also coplanar with the leaf spring 630.1. The embodiment of the motor assembly as schematically shown in FIG. 6 further comprises a first bearing 662 constructed and arranged to maintain the first magnet assembly 612 and the first coil assembly 622 spaced apart and a second bearing 664 constructed and arranged to maintain the second magnet assembly 514 and the second coil assembly 524 spaced apart. Such bearings may e.g. be preloaded air bearings or the like. The bearings may e.g. include porous bearing pads through which a gas such as air is supplied. In the embodiment as shown, an attractive force will occur between the magnet arrays of the magnet assemblies 612, 614 and the respective back-irons 622.2, 624.2 of the coil assemblies. This attractive force may serve as a pre-load for the bearings 662, 664.

Figure 7:
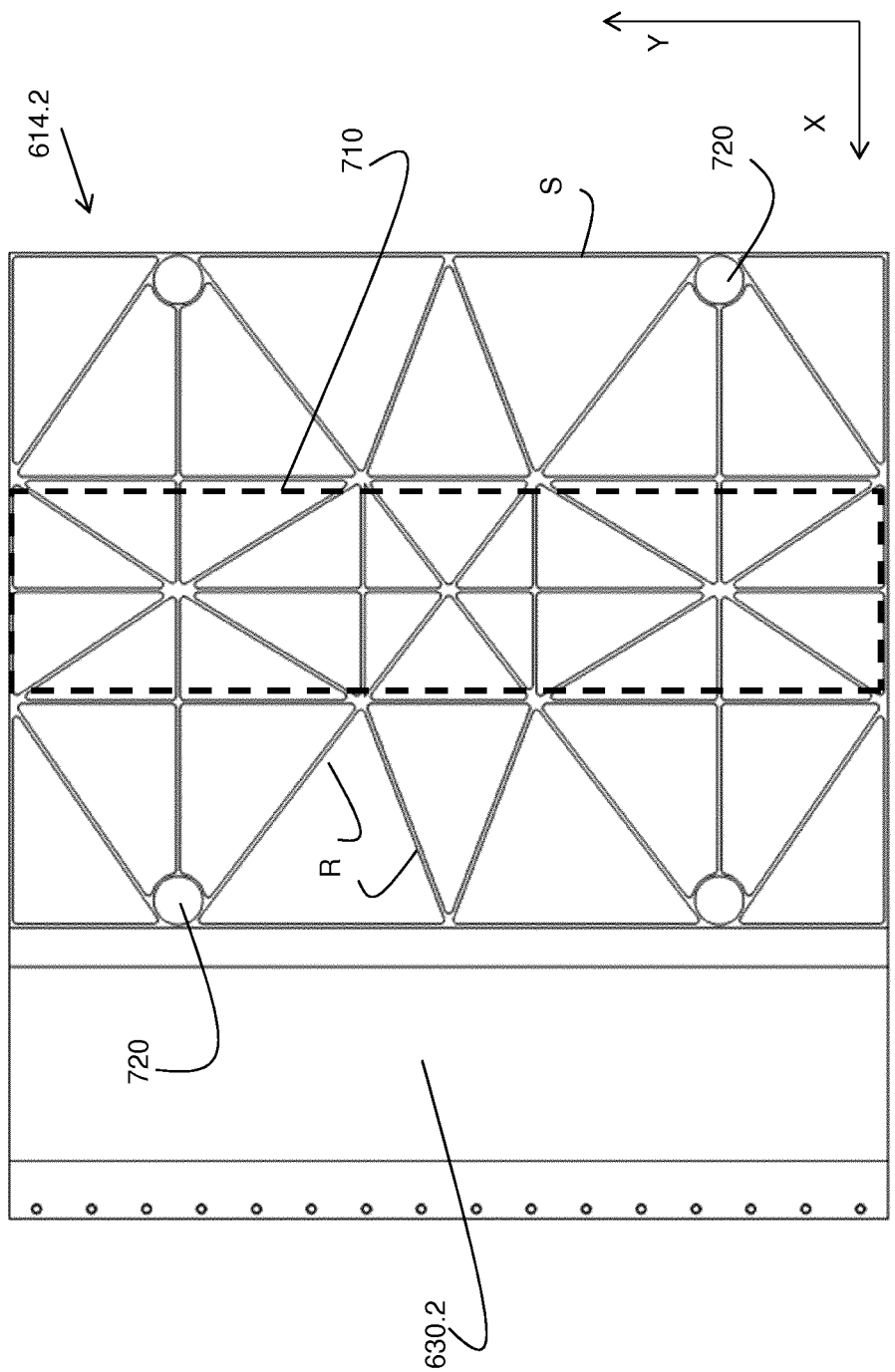
FIG. 7 depicts a plan view of a magnet support structure of an embodiment of a motor assembly according to the present invention.

FIG. 7 schematically shows a top view (i.e. a view in the XY-plane) of the structure 614.2 of FIG. 6. As can be seen, the structure has an open box structure with sidewalls S and reinforcement ribs R. The dotted line 710 schematically indicates the position of the magnet array 614.1 which is mounted to the structure, in order to obtain the magnet assembly 614 of FIG. 6. FIG. 7 also shows the leaf spring 630.2 connected to the structure 614.2. In an embodiment, the leaf spring 630.2 and the structure 614.2 may be machined as a single piece, e.g. starting from an aluminum piece of material.

FIG. 7 also schematically shows 4 apertures 720 in the structure 614.2 for accommodating a gas supply to the bearing 664. Because of the use of 4 bearing pads, in the embodiment as shown, the positioning of the bearing 664 on the running surface 624.6 (see FIG. 6) is overdetermined. In order to mitigate or overcome this, it may be advantageous to design the structure 614.2 with a comparatively low torsional stiffness about the Y-axis or the X-axis or both. An open box structure may be especially suited for providing the comparatively low torsional stiffness about the Y-axis and the X-axis. Alternatively, it may be preferred to design the structure as having a comparatively high bending stiffness about said axis.

As already illustrated in FIGS. 5 and 6, the construction of the motor assembly according to the invention enables an independent control of the gaps between co-operating coil assemblies and magnet assemblies.

In FIGS. 5 and 6, this independent control is realized by a flexible mounting of the magnet assemblies relative to each other in the direction perpendicular to the driving direction, i.e. the Z-direction in FIGS. 5 and 6, the driving direction being the Y-direction, perpendicular to the plane of the drawing.

The following Figures show some alternative arrangements that enable the same independent control of the gaps between the co-operating coil assemblies and magnet assemblies.

Figure 8:
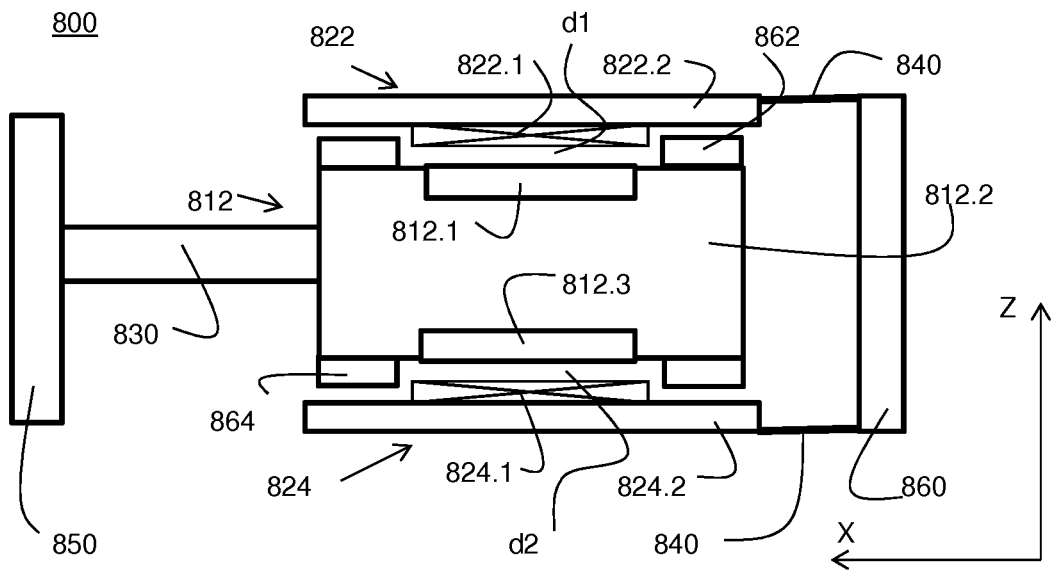
FIG. 8 depicts a cross-sectional view of a third embodiment of a motor assembly according to the present invention.

FIG. 8 schematically shows a motor assembly 800 according to another embodiment of the present invention. In the embodiment as shown, the motor assembly comprises two magnet arrays 812.1, 812.3 of the magnet assembly 812, the magnet arrays being mounted on a common structure 812.2 of the magnet assembly, the magnet assembly being mounted to an object 850, e.g. an object to be driven or a frame or a balance mass, by means of an interface 830, e.g. a rigid connection. The motor assembly 800 further comprises two coil assemblies 822, 824, each comprising a coil array 822.1, 824.1, the coil arrays being mounted to respective members 822.2, 824.2 of the coil arrays 822, 824. In the embodiment as shown, the coil assemblies 822, 824 are mounted to an object 860 by means of an interface comprising a pair of leaf springs 840. The leaf springs enable a displacement of coil assemblies 822, 824 relative to each other in the Z-direction. FIG. 8 further schematically shows bearings 862 and 864 for maintaining the gaps d1 and d2 between the coil assemblies 822 and 824 and the respective co-operating magnet arrays 812.1, 812.3.

Figure 9:
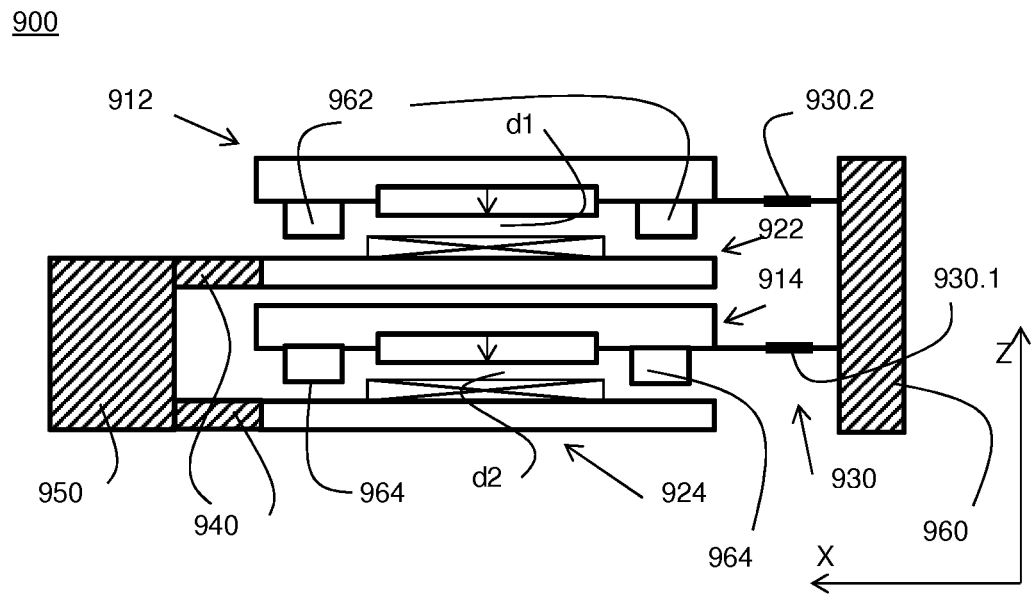
FIG. 9 depicts a cross-sectional view of a fourth embodiment of a motor assembly according to the present invention.

FIG. 9 schematically shows yet another embodiment of a motor assembly according to the present invention. In the embodiment as shown, the motor assembly 900 comprises two magnet assemblies 912, 914, configured to co-operate with two coil assemblies 922, 924. In the cross-sectional view as shown, the magnet assemblies 912, 914 and the coil assemblies 922, 924 are alternatingly arranged in the Z-direction. In the embodiment as shown, the coil assemblies 922, 924 are mounted to an object 950 by means of an interface 940, e.g. a substantially rigid connection. The magnet assemblies 912, 914 are connected to an object 960 by means of an interface 930 that enables the magnet assemblies 912, 914 to displace in the indicated Z-direction relative to each other. In the embodiment as shown, the magnet assemblies 912, 914 are connected to the object 960 by means of leaf springs 930.1, 930.2. As a result, bearings 962 and 964 can maintain the gaps d1 and d2 between the coil assemblies 922 and 924 and the respective co-operating magnet arrays 912, 914 to a desired value. In the embodiment as shown, the object 950 can e.g. be one of an object to be driven or a frame or balance mass, whereas the object 960 may be the other of the object to be driven or the frame or balance mass.

In the embodiments as shown in FIGS. 5 to 9, one of the interfaces connecting the coil assemblies or the magnet assemblies (in general the first electromagnetic assemblies or the second electromagnetic assemblies) is configured to enable a relative displacement between the respective coil assemblies or the magnet assemblies in the direction perpendicular to the driving direction.

Figure 10:
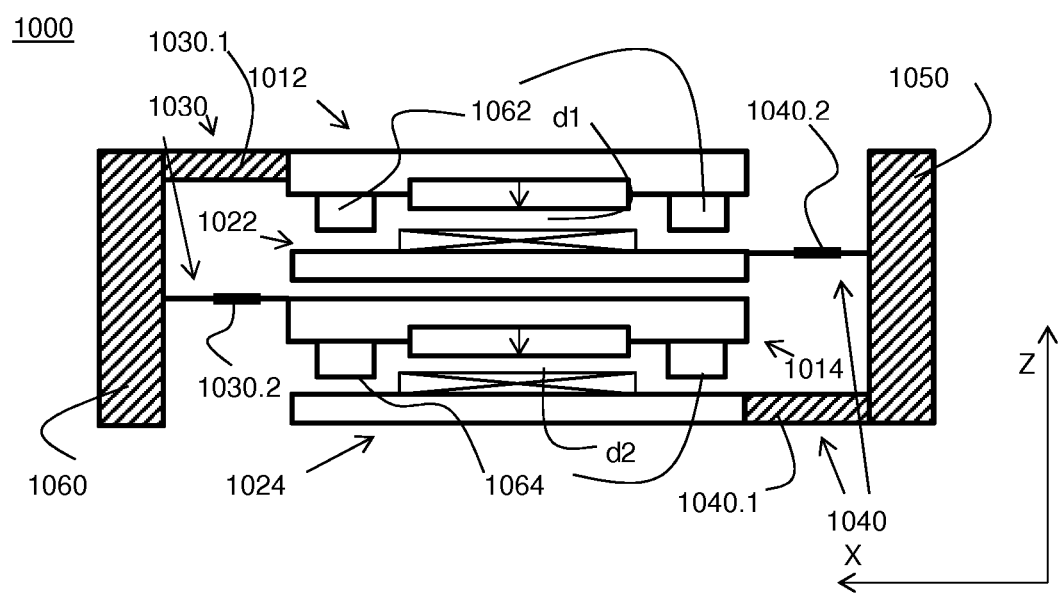
FIG. 10 depicts a cross-sectional view of a fifth embodiment of a motor assembly according to the present invention.

FIG. 10 schematically shows an embodiment wherein both interfaces enables such relative displacement of the attached electromagnetic assemblies. In the embodiment as shown, the motor assembly 1000 comprises two magnet assemblies 1012,1014, configured to co-operate with two coil assemblies 1022, 1024. In the cross-sectional view as shown, the magnet assemblies 1012, 1014 and the coil assemblies 1022, 1024 are alternatingly arranged in the Z-direction. In the embodiment as shown, the coil assemblies 1022, 1024 are mounted to an object 1050 by means of an interface 1040. E.g. the interface 1040 provides a substantially rigid connection 1040.1 between the coil assembly 1024 and the object 1050 and a flexible connection 1040.2, flexible in the Z-direction, between the coil assembly 1022 and the object 1050. The flexible connection 1040.2 may e.g. be a leaf spring configure to enable the coil assembly 1022 to displace relative to the coil assembly 1024 in the Z-direction. The magnet assemblies 1012, 1014 are connected to an object 1060 by means of an interface 1030 that enables the magnet assemblies to displace in the indicated Z-direction relative to each other. In the embodiment as shown, the magnet assemblies 1012, 1014 are connected to the object 1060 by means of respectively a substantially rigid connection 1030.1 and a leaf springs 1030.2. As a result, bearings 1062 and 1064 can maintain the gaps d1 and d2 between the coil assemblies 1022 and 1024 and the respective co-operating magnet arrays 1012, 1014 to a desired value. In the embodiment as shown, the object 1050 can e.g. be one of an object to be driven or a frame or balance mass, whereas the object 1060 may be the other of the object to be driven or the frame or balance mass.

Figure 11:
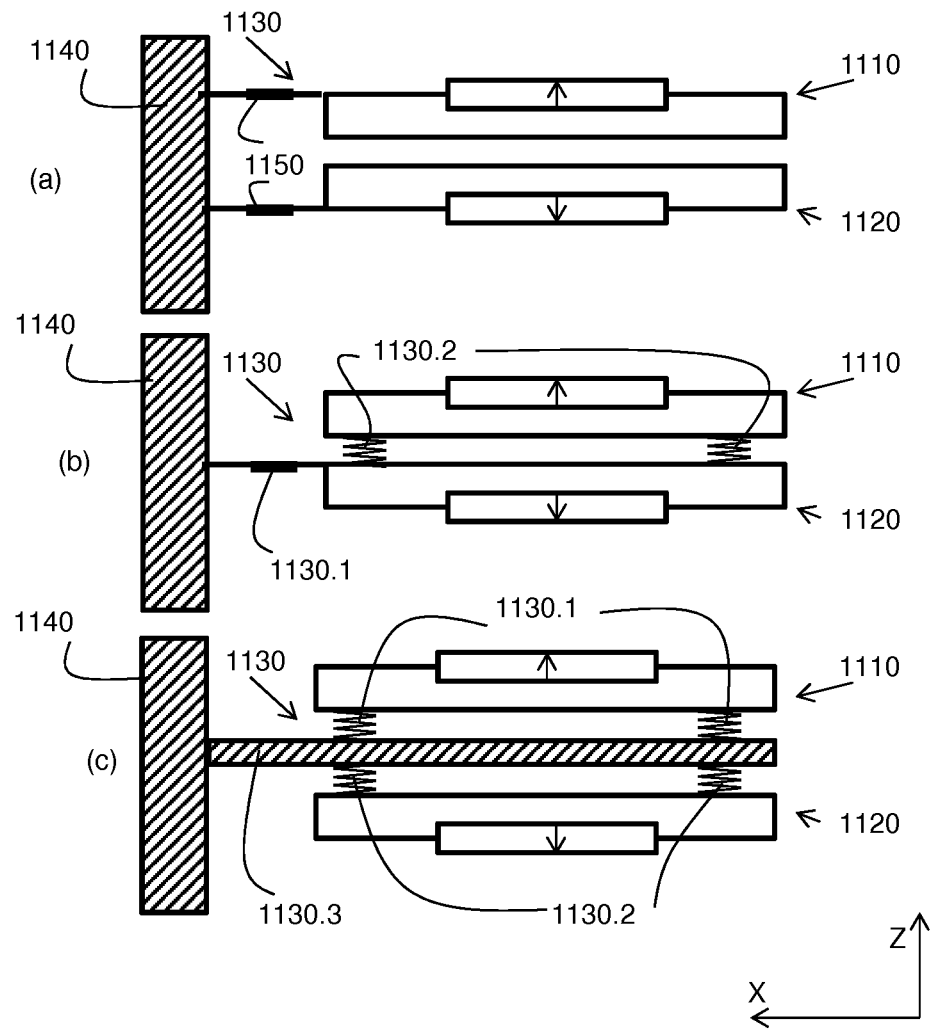
FIG. 11 depicts different cross-sectional views of flexible interface arrangements as can be applied in the present invention.

In order to enable an accurate and independent control of the gaps (in the direction perpendicular to the driving direction) between co-operating magnet assemblies and coil assemblies, the motor assembly according to the present invention provides in one or more interfaces between the coil assemblies or the magnet assemblies that enable them to displace relative to each other in the direction perpendicular to the driving direction. FIG. 11 schematically shows various embodiments of such an interface. FIG. 11(*a*) schematically shows an interface 1130 connecting two magnet assemblies 1110 and 1120 to an object 1140 by means of two leaf springs 1150, the leaf springs providing a flexible connection in the Z-direction, thereby enabling the magnet assemblies 1110 and 1120 to displace relative to each other in the Z-direction. In addition, the leaf springs 1150 are substantially rigid, i.e. have a comparatively high stiffness, in the drive or driving direction, i.e. the Y-direction perpendicular to the XZ-plane of the drawing. FIG. 11(*b*) shows an alternative arrangement whereby the magnet assemblies 1110, 1120 are mounted to the object 1140 by means of an interface 1130 comprising a leaf spring 1130.1 connecting the magnet assembly 1120 to the object 1140 and a flexible connector 1130.2, e.g. a spring-type connection, connecting the magnet assembly 1110 to the magnet assembly 1120. In order to maintain the proper relative position of the magnet assemblies 1110 and 1120 in the Y-direction, both the leaf spring 1130.1 and the flexible connection 1130.2 should be substantially rigid in the drive direction, i.e. the Y-direction. FIG. 11(*c*) schematically shows yet another alternative, whereby the magnet assemblies 1110 and 1120 are connected to a substantially rigid member 1130.3 of an interface 1130 by means of flexible connectors 1130.1, 1130.2, e.g. spring-type connections, the flexible connectors enabling a displacement of the magnet assemblies relative to the member 1130.3 in the Z-direction, and thus enable the magnet assemblies to displace relative to each other in the Z-direction. In order to maintain the proper relative position of the magnet assemblies 1110 and 1120 in the Y-direction, the flexible connections 1130.1, 1130.2 should be substantially rigid in the drive direction, i.e. the Y-direction. It may further be pointed out that, with respect to the arrangement (a) in FIG. 11, additional springs may be arranged between the assemblies 1110, 1120, e.g. to provided in a pre-load force, in the Z-direction, for pre-loading a bearing.

Note that the same arrangements may be applied to enable the coil assemblies as applied to displace relative to each other in a direction perpendicular to the driving direction. In addition, interface arrangements as shown in FIG. 10, whereby one of the electromagnetic assemblies is rigidly connected may be applied as well.

The motor assemblies as shown each comprise two coil assemblies co-operating with two respective magnet assemblies. As will be clear to the skilled person, the motor assembly according to the present invention may also be equipped with more than two coil assemblies and co-operating magnet assemblies.

In the present invention, an accurate control of gaps, often referred to as air gaps, between co-operating coil assemblies and magnet assemblies of a linear motor is enabled. The magnet assemblies or coil assemblies or both of the motor assembly according to the present invention are stacked in a direction perpendicular to the driving direction. In the embodiments as shown so far, the assemblies are arranged in planes that are parallel to the XY-plane, i.e. the coils or magnets of the assemblies extend in XY-planes, the assemblies being stacked in a direction perpendicular to said XY-planes. Within the meaning of the present invention, an arrangement of assemblies being stacked in a certain direction implies that the assemblies overlap, i.e. are arranged on top of each other in said direction, e.g. the Z-direction. In addition, the gaps existing between the co-operating coil assemblies and magnet assemblies are considered in the same direction as the direction in which the assemblies are stacked. So, in case the magnets and coils of the assemblies substantially extend in the XY-plane, the gaps referred to in the above description are gaps extending in the Z-direction, i.e. perpendicular to the XY-plane.

In the embodiments as shown so far, the motor assembly has the same number of coil assemblies and magnet assemblies. However, it can be noted that motor assemblies are feasible, within the present invention, that have a different number of coil assemblies and magnet assemblies while still providing the advantage of enabling an independent control of the gaps between coil assemblies and magnet assemblies. An example of such a motor assembly may e.g. be derived from the embodiment shown in FIG. 8. In the embodiment of FIG. 8, the magnet arrays 812.1 and 812.3 are mounted to the same structure 812.2. As an alternative to the arrangement shown, a single magnet array could be applied, the single magnet array co-operating with two coil arrays. Such an embodiment is schematically shown in FIG. 12.

Figure 12:
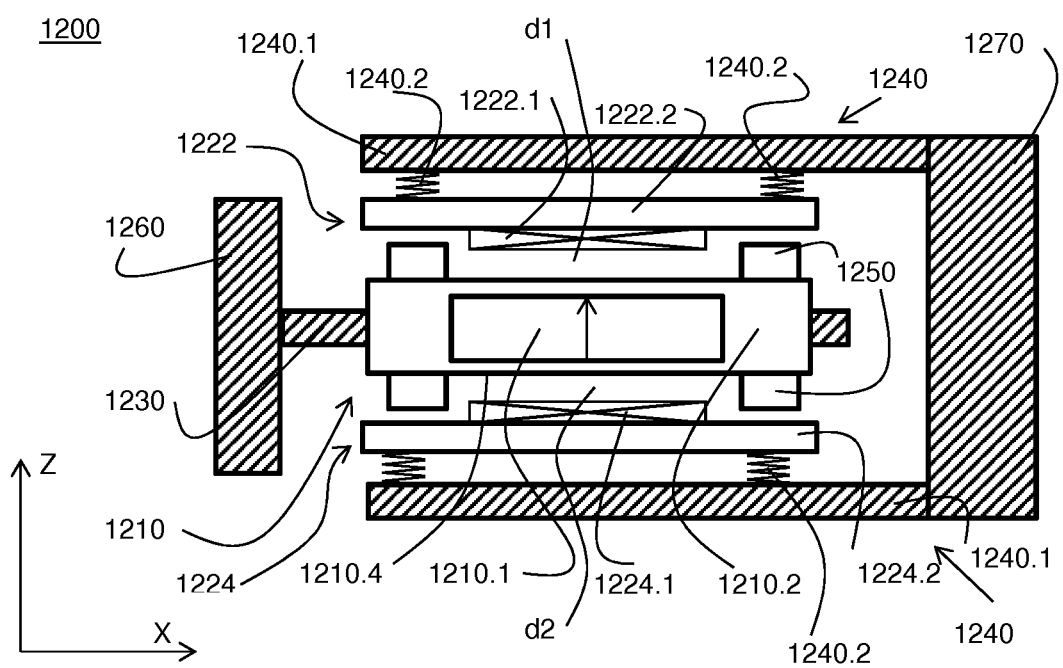
FIG. 12 depicts a cross-sectional view of a sixth embodiment of a motor assembly according to the present invention.

FIG. 12 schematically shows a cross-sectional view of an embodiment of a motor assembly for driving an object in a driving direction, i.e. the Y-direction perpendicular to the XZ-plane of the drawing. The motor assembly 1200 comprises a first electromagnetic assembly 1210 and a second electromagnetic assembly 1220. The second electromagnetic assembly 1220 comprises a first electromagnetic sub-assembly 1222 configured to co-operate with the first electromagnetic assembly 1210 for generating a first driving force in the driving direction. A second electromagnetic sub-assembly 1224 is configured to co-operate with the first electromagnetic assembly 1210 for generating a second driving force in the driving direction. In the embodiment as shown, the first electromagnetic assembly 1210 comprises an array of permanent magnets 1210.1, arranged in the driving direction, i.e. the Y-direction. The magnet array is mounted to a magnet support structure 1210.2, e.g. a non-magnetic structure for holding the magnet array 1210.1. The first and second sub-assemblies 1222 and 1224 of the second electromagnetic assembly each comprise a respective coil array 1222.1. 1224.1 mounted to a respective back-iron 1222.2, 1224.2. In the embodiment as shown, the first electromagnetic sub-assembly 1222, in particular the coil array of the sub-assembly 1222, faces a first surface 1210.3 of the first electromagnetic assembly 1210, thereby defining a first gap d1 between the first electromagnetic assembly 1210 and the second electromagnetic assembly 1220 in a direction perpendicular to the driving direction, i.e. the Z-direction. Further, the second electromagnetic sub-assembly 1224, in particular the coil array 1224.1 of the sub-assembly 1224, faces a second surface 1210.4 of the first electromagnetic assembly 1210, thereby defining a second gap d2 between the first electromagnetic assembly 1210 and the second electromagnetic assembly 1220 in the direction perpendicular to the driving direction. The motor assembly 1200 is further provided with bearings 1250 for maintaining the gaps d1 and d2 between the first electromagnetic assembly 1210 and the sub-assemblies 1222, 1224. The arrangement as shown further comprises a first interface 1230 and a second interface 1240. The first interface 1230 is for connecting the first electromagnetic assembly 1210 to an object 1260, i.e. one of a common member or the object to be driven. The second interface 1240 is for connecting the second electromagnetic assembly 1220 to an object 1270, i.e. the other one of the common member or the object to be driven. In the embodiment as shown, the second interface comprises rigid members 1240.1 and flexible connections 1240.2. The flexible connections 1240.2 connect the sub-assemblies to the rigid members 1240.1 in such manner as to enable a relative displacement between the first and the second electromagnetic sub-assembly in the direction perpendicular to the driving direction. In the embodiment as shown, the coil assemblies 1222, 1224 can be considered to share a magnet assembly 1210. As will be understood by the skilled person, an alternative embodiment could also be devised whereby two magnet assemblies would share a coil assembly.

In the embodiments as shown, the magnet assemblies comprise array of permanent magnets that are configured to generate a spatially alternating magnetic field in the Y-direction. Such a magnetic field distribution may e.g. be generated by an array of magnets 220.1 as e.g. shown in FIG. 2a. Alternative arrays may e.g. include Hallbach arrays as well.

In the embodiments as shown, the coil assemblies may e.g. comprise arrays of coils arranged adjacent in the driving direction, arrays as e.g. shown in FIGS. 2a and 2b. Alternatively, the coils of the coil arrays may partially overlap in the Y-direction or may be wound about ferromagnetic teeth of a ferromagnetic yoke.

Although the embodiments of the motor assemblies as shown focus on motor assemblies enabling a linear displacement of an object, it is submitted that the same principles may by applied in a rotary motor assembly or a planar motor as well.

In an embodiment, there is provided a motor assembly for driving an object in a driving direction, the motor assembly comprising: a plurality of linear motors, each motor configured to generate a driving force in the driving direction, each of the linear motors comprising: a first electromagnetic assembly and a second electromagnetic assembly, configured to co-operate with the first electromagnetic assembly, for generating the driving force; wherein the first electromagnetic assembly and the second magnetic assembly face each other and define a gap between each other in a direction perpendicular to the driving direction; a first interface for connecting the first electromagnetic assemblies to a common member; and a second interface for connecting the second electromagnetic assemblies to the object, wherein the first electromagnetic assemblies and the second electromagnetic assemblies are stacked in the direction perpendicular to the driving direction, and wherein at least one of the first and second interfaces is configured to enable a relative displacement between the respective first electromagnetic assemblies and the second electromagnetic assemblies in the direction perpendicular to the driving direction.

In an embodiment, each of the linear motors comprises a bearing for maintaining the gap during operation. In an embodiment, at least one of the first electromagnetic assemblies is connected to the common member by means of one or more leaf springs. In an embodiment, at least one of the second electromagnetic assemblies is connected to the object by means of one or more leaf springs. In an embodiment, the first electromagnetic assembly of each of the linear motors comprises a coil assembly and wherein the second electromagnetic assembly of each of the linear motors comprises a magnet assembly. In an embodiment, the coil assembly comprises an array of coils, arranged adjacent each other in the driving direction. In an embodiment, the magnet assembly comprises an array of permanent magnets configured to generate a spatially varying magnetic field in the driving direction. In an embodiment, the magnet assembly comprises a magnet support structure onto which the array of permanent magnets is mounted. In an embodiment, the magnet support structure has an open box structure.

In an embodiment, there is provided a motor assembly for driving an object in a driving direction, the motor assembly comprising: a first electromagnetic assembly and a second electromagnetic assembly, wherein the second electromagnetic assembly comprises a first electromagnetic sub-assembly configured to co-operate with the first electromagnetic assembly for generating a first driving force in the driving direction and a second electromagnetic sub-assembly configured to co-operate with the first electromagnetic assembly for generating a second driving force in the driving direction; wherein the first electromagnetic sub-assembly faces a first surface of the first electromagnetic assembly, thereby defining a first gap between the first electromagnetic assembly and the second electromagnetic assembly in a direction perpendicular to the driving direction; wherein the second electromagnetic sub-assembly faces a second surface of the first electromagnetic assembly, thereby defining a second gap between the first electromagnetic assembly and the second electromagnetic assembly in the direction perpendicular to the driving direction; a first interface for connecting the first electromagnetic assembly to one of a common member or the object to be driven; and a second interface for connecting the second electromagnetic assembly to the other one of the common member or the object to be driven, wherein the first electromagnetic assembly, the first electromagnetic sub-assembly and the second electromagnetic sub-assembly are stacked in the direction perpendicular to the driving direction, and wherein the second interface is configured to enable a relative displacement between the first and the second electromagnetic sub-assemblies in the direction perpendicular to the driving direction.

In an embodiment, the motor assembly comprises a bearing assembly for maintaining the first and second gap during operation.

In an embodiment, there is provided a lithographic apparatus comprising: a support constructed to support a patterning device, the patterning device being capable of imparting a radiation beam with a pattern in its cross-section to form a patterned radiation beam; a substrate table constructed to hold a substrate; a projection system configured to project the patterned radiation beam onto a target portion of the substrate; and the motor assembly according to claim 10 to position the support or the substrate table.

In an embodiment, there is provided a device manufacturing method, the method comprising projecting a patterned beam of radiation onto a substrate using a lithographic apparatus as described herein.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate W referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate W may be processed more than once, for example in order to create a multi-layer IC, so that the term substrate W used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device MA defines the pattern created on a substrate. The topography of the patterning device may be pressed into a layer of resist supplied to the substrate whereupon the resist is cured by applying electromagnetic radiation, heat, pressure or a combination thereof. The patterning device MA is moved out of the resist leaving a pattern in it after the resist is cured.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A motor assembly for driving an object in a driving direction, the motor assembly comprising:
a first electromagnetic assembly and a second electromagnetic assembly, wherein the second electromagnetic assembly comprises a first electromagnetic sub-assembly configured to co-operate with the first electromagnetic assembly to generate a first driving force in the driving direction and a second electromagnetic sub-assembly configured to co-operate with the first electromagnetic assembly to generate a second driving force in the driving direction; wherein the first electromagnetic sub-assembly faces a first surface of the first electromagnetic assembly, thereby defining a first gap between the first electromagnetic assembly and the second electromagnetic assembly in a direction perpendicular to the driving direction: wherein the second electromagnetic sub-assembly faces a second surface of the first electromagnetic assembly, thereby defining a second gap between the first electromagnetic assembly and the second electromagnetic assembly in the direction perpendicular to the driving direction;
a first interface configured to connect the first electromagnetic assembly to a common member or the object to be driven; and
a second interface configured to connect the second electromagnetic assembly to the other of the common member or the object to be driven,
wherein the first electromagnetic assembly, the first electromagnetic sub-assembly and the second electromagnetic sub-assembly are stacked in the direction perpendicular to the driving direction, and wherein the second interface comprises a passive device configured to enable a relative displacement between the first and the second electromagnetic sub-assemblies in the direction perpendicular to the driving direction.

2. The motor assembly according to claim 1, comprising a bearing assembly configured to maintain the first and/or second gap during operation.

3. The motor assembly according to claim 2, wherein the first electromagnetic assembly is connected to the common member or the object to be driven by means of one or more leaf springs.

4. The motor assembly according to claim 2, wherein the second electromagnetic assembly is connected to the other of the common member or the object to be driven by means of one or more leaf springs.

5. The motor assembly according to claim 1, wherein the first electromagnetic assembly comprises a coil assembly and wherein the second electromagnetic assembly comprises a magnet assembly.

6. The motor assembly according to claim 5, wherein the coil assembly comprises an array of coils, arranged adjacent each other in the driving direction.

7. The motor assembly according to claim 6, wherein the magnet assembly comprises an array of permanent magnets configured to, generate a spatially varying magnetic field in the driving direction.

8. The motor assembly according to claim 7, wherein the magnet assembly comprises a magnet support structure onto which the array of permanent magnets is mounted.

9. The motor assembly according to claim 8, wherein the magnet support structure has an open box structure.

10. A lithographic apparatus comprising:
a support constructed to support a patterning device, the patterning device being capable of imparting a radiation beam with a pattern in its cross-section to form a patterned radiation beam;
a substrate table constructed to hold a substrate;
a projection system configured to project the patterned radiation beam onto a target portion of the substrate; and
the motor assembly according to claim 1 to position the support or the substrate table.

11. The lithographic apparatus according to claim 10, wherein the first electromagnetic assembly is connected to the common member and the second electromagnetic assembly is connected to the object to be driven.

12. The lithographic apparatus according to claim 10, wherein the first electromagnetic assembly comprises a coil assembly and wherein the second electromagnetic assembly comprises a magnet assembly.

13. The lithographic apparatus according to claim 12, wherein the magnet assembly comprises a magnet support structure onto which the array of permanent magnets is mounted, the magnet support structure having an open box structure.

14. The lithographic apparatus according to claim 13, wherein the first electromagnetic assembly is connected to the common member and the second electromagnetic assembly is connected to the object to be drive.

15. A device manufacturing method, comprising:
providing relative movement between a first electromagnetic assembly and a second electromagnetic assembly to drive an object in a driving direction,
wherein the first electromagnetic assembly is connected to a common member or the object to be driven,
wherein the second electromagnetic assembly to the other of the common member or the object to be driven,
wherein the second electromagnetic assembly comprises a first electromagnetic sub-assembly co-operating with the first electromagnetic assembly to generate a first driving force in the driving direction and a second electromagnetic sub-assembly co-operating with the first electromagnetic assembly to generate a second driving force in the driving direction,
wherein the first electromagnetic sub-assembly faces a first surface of the first electromagnetic assembly to define a first gap between the first electromagnetic assembly and the second electromagnetic assembly in a direction perpendicular to the driving direction,
wherein the second electromagnetic sub-assembly faces a second surface of the first electromagnetic assembly to define a second gap between the first electromagnetic assembly and the second electromagnetic assembly in the direction perpendicular to the driving direction,
wherein the first electromagnetic assembly, the first electromagnetic sub-assembly and the second electromagnetic sub-assembly are stacked in the direction perpendicular to the driving direction, and
wherein the first and the second electromagnetic sub-assemblies are arranged to enable a relative displacement between the first and the second electromagnetic sub-assemblies in the direction perpendicular to the driving direction using a passive displacement device; and
projecting a patterned beam of radiation onto a substrate.

16. The method according to claim 15, wherein the object is a support structure configured to support a patterning device, the patterning device configured to form the patterned radiation beam, or a substrate table configured to support the substrate.

17. The method according to claim 15, wherein the first electromagnetic assembly is connected to the common member and the second electromagnetic assembly is connected to the object to be driven.

18. The method according to claim 15, wherein the first electromagnetic assembly comprises a coil assembly and wherein the second electromagnetic assembly comprises a magnet assembly.

19. The method according to claim 18, wherein the magnet assembly comprises a magnet support structure onto which the array of permanent magnets is mounted, the magnet support structure having an open box structure.

20. The method according to claim 19, wherein the first electromagnetic assembly is connected to the common member and the second electromagnetic assembly is connected to the object to be driven.

21. The method according to claim 15, wherein the passive displacement device is a leaf spring or a flexible connection.

22. A motor assembly for driving an object in a driving direction, the motor assembly comprising:
a first electromagnetic assembly and a second electromagnetic assembly, wherein the second electromagnetic assembly comprises a first electromagnetic sub-assembly configured to co-operate with the first electromagnetic assembly to generate a first driving force in the driving direction and a second electromagnetic sub-assembly configured to co-operate with the first electromagnetic assembly to generate a second driving force in the driving direction; wherein the first electromagnetic sub-assembly faces a first surface of the first electromagnetic assembly, thereby defining a first gap between the first electromagnetic assembly and the second electromagnetic assembly in a direction perpendicular to the driving direction; wherein the second electromagnetic sub-assembly faces a second surface of the first electromagnetic assembly, thereby defining a second gap between the first electromagnetic assembly and the second electromagnetic assembly in the direction perpendicular to the driving direction;

a first interface configured to connect the first electromagnetic assembly to a common member or the object to be driven; and a second interface configured to connect the second electromagnetic assembly to the other of the common member or the object to be driven, wherein the first electromagnetic assembly, the first electromagnetic sub-assembly and the second electromagnetic sub-assembly are stacked in the direction perpendicular to the driving direction, and wherein the second interface is configured to enable a relative displacement between the first and the second electromagnetic sub-assemblies in the direction perpendicular to the driving direction, and wherein the first electromagnetic assembly is connected to the common member or the object to be driven by means of one or more leaf springs or the second electromagnetic assembly is connected to the other of the common member or the object to be driven by means of one or more leaf springs.

* * * * *